US 6,639,446 B2

(12) United States Patent
Komurasaki et al.

(10) Patent No.: US 6,639,446 B2
(45) Date of Patent: Oct. 28, 2003

(54) HIGH LINEARITY, HIGH GAIN MIXER CIRCUIT

(75) Inventors: Hiroshi Komurasaki, Tokyo (JP); Hisayasu Sato, Tokyo (JP); Kimio Ueda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/193,300

(22) Filed: Jul. 12, 2002

(65) Prior Publication Data

US 2003/0052727 A1 Mar. 20, 2003

(30) Foreign Application Priority Data

Sep. 5, 2001 (JP) .......................... 2001-269328

(51) Int. Cl.[7] .............................. G06G 7/12; G06G 7/16; G06F 7/44
(52) U.S. Cl. .......................... 327/355; 327/356; 455/333
(58) Field of Search ................................ 327/355, 356, 327/113, 114, 118, 119; 455/333

(56) References Cited

U.S. PATENT DOCUMENTS

| 4,459,556 A | * | 7/1984 | Nanbu et al. ............... 330/278 |
| 4,845,389 A | * | 7/1989 | Pyndiah et al. ............. 327/113 |
| 5,444,399 A | * | 8/1995 | Shiga ......................... 327/105 |
| 5,448,197 A | * | 9/1995 | Sagawa et al. ............. 327/408 |
| 5,767,726 A | * | 6/1998 | Wang ......................... 327/356 |
| 6,044,255 A | * | 3/2000 | Suematsu et al. ........... 455/333 |
| 6,127,892 A |   | 10/2000 | Komurasaki et al. ....... 330/277 |
| 2001/0033193 A1 | * | 10/2001 | Chien |

FOREIGN PATENT DOCUMENTS

JP                 11-31925              2/1999

OTHER PUBLICATIONS

H. Wang, "A 1V Multi–Gigahertz RF Mixer Core in 0.5µm CMOS", SP 23.4, IEEE International Solid–State Circuits Conference, 1998, pp. 370–371, Institute of Electrical and Electronics Engineers (IEEE), New York, NY.

* cited by examiner

Primary Examiner—Tuan T. Lam
(74) Attorney, Agent, or Firm—Burns, Doane, Swecker & Mathis, LLP

(57) ABSTRACT

A mixer circuit includes a first signal input terminal connected to the gate of a first MOSFET, and a second signal input terminal connected to the gate of a second MOSFET. The mixer circuit is configured such that a relationship $(V_{G1}-V_{GS2})<(V_{GS2}-V_{T1})$ is established, where $V_{G1}$ is a bias voltage applied to the gate of the first MOS transistor, $V_{GS2}$ is a bias voltage applied to the gate of the second MOS transistor, and $V_{T1}$ is a threshold voltage of the first MOS transistor, the bias voltages $V_{G1}$ and $V_{GS2}$ being each defined with respect to the source bias voltage of the second MOS transistor. This can implement high linearity mixer circuit even when operated at a low power supply voltage.

17 Claims, 5 Drawing Sheets

HIGH LINEARITY, HIGH GAIN MIXER CIRCUIT

BACKGROUND OF THE INVENTION

1. Field of the Invention

The present invention relates to a mixer circuit with high linearity and high gain.

2. Description of Related Art

FIG. 9 is a circuit diagram showing a configuration of a conventional cascode mixer circuit with a source connected to a negative feedback impedance element. In FIG. 9, the reference symbol $V_{DD}$ designates a power supply terminal; Z11 designates an impedance element that has a DC path and is connected to the power supply terminal $V_{DD}$; Z12 designates an impedance element that has a DC path and is connected to the impedance element Z11.

The reference symbol M1 designates a MOSFET having its drain connected to the impedance element Z12; M2 designates a MOSFET having its drain connected to the source of the MOSFET M1; and Zs designates an impedance element that has a DC path and is connected across the source of the MOSFET M2 and a ground terminal. The back gates of the MOSFETs M1 and M2 are connected to the ground terminal.

The impedance elements Z11, Z12 and Zs are each composed of a passive element such as a resistor, capacitor and inductance.

The reference symbol LOin designates an LO (local) signal input terminal connected to the gate of the MOSFET M1; RFin designates an RF (radio frequency) signal input terminal connected to the gate of the MOSFET M2; and IFout designate an output terminal connected between the impedance elements Z11 and Z12.

Next, the operation of the conventional cascode mixer circuit will be described.

The RF input signal fed through the RF signal input terminal RFin is a small signal expressed by $A_{RFIN}\sin(\omega_{RF} t)$. On the other hand, the LO input signal fed through the LO signal input terminal LOin is a large signal expressed by $sq(\omega_{LO} t)$ which switches the MOSFET M1.

The output signal $IF_{OUT}$ produced from the output terminal IFout is expressed as follows.

$$IF_{OUT} = Z11 \times \beta A_{RFIN}\sin(\omega_{RF}t) \times sq(\omega_{LO}t) \quad (1)$$
$$= \beta Z11 A_{RFIN}\sin(\omega_{RF}t) \times (2/\pi)[(\pi/4) + \sin(\omega_{LO}t) + \ldots]$$

where $\beta$ is a transconductance of the MOSFET M2 determined by its process and device structure.

The major output signal component $S_M$ without the DC component is expressed by the following expression (2).

$$S_M \approx (2/\pi)\beta Z11 A_{RFIN}\sin(\omega_{RF}t) \times \sin(\omega_{LO}t) \quad (2)$$
$$= (1/\pi)\beta Z11 A_{RFIN} \times [\cos(|\omega_{RF} - \omega_{LO}|t) - \cos((\omega_{RF} + \omega_{LO})t)]$$

Thus, two frequency components, the sum and difference components of the RF input signal and LO input signal, are obtained, making it possible to obtain one of them by filtering the output signal $IF_{OUT}$ in an actual application.

One of the causes of the distortion of the mixer circuit as shown in FIG. 9 is the nonlinearity of the drain source transconductance $g_{ds}$ of the MOSFET M2, which is given by the following expression (3).

$$g_{ds} = \frac{k_{ds}}{2L\sqrt{V_{DS} - (V_{GS} - V_T) + \phi_0}} I_{Dsat} \quad (3)$$

$$I_{Dsat} = \frac{\beta}{2}(V_{GS} - V_T)^2$$

where L is the length of the gate of the MOSFET M2, $V_{GS}$ is the gate-source voltage, $V_{DS}$ is the drain-source voltage, $V_T$ is the threshold voltage, $\Phi_o$ is the built-in voltage, and $k_{ds}$ is a constant determined by the process.

Thus, the changes in the drain-source transconductance $g_{ds}$ against the drain-source voltage $V_{DS}$ is expressed by the following expression (4), and the distortion becomes large when the drain-source voltage $V_{DS}$ is small.

$$\frac{\partial g_{ds}}{\partial V_{DS}} = \frac{-k_{ds}}{4L(V_{DS} - (V_{GS} - V_T) + \Phi_0)^{\frac{3}{2}}} I_{Dsat} \quad (4)$$

With the foregoing configuration, the conventional mixer circuit has the following problems. First, although the MOSFET M1 determines the drain-source voltage $V_{DS}$ of the MOSFET M2 to which the RF input signal is applied, it is difficult to apply a large bias to the MOSFET M1, particularly when the power supply voltage is small. Thus, it has a problem of increasing the distortion.

In addition, to achieve the high gain, the impedance element Z11 or the gate-source voltage $V_{GS}$ of the MOSFET M2 must be increased. However, operation at the low power supply voltage in these cases will present the following problems. First, increasing the impedance element Z11 will drop the drain potential, which can disable the operation of the MOSFET M2. Second, as for the gate-source voltage $V_{GS}$, since the bias voltage beyond the power supply voltage is impossible, such a condition as the power supply voltage of 1.0 V and the threshold voltage $V_T$ of 0.35 V cannot achieve a large gain.

SUMMARY OF THE INVENTION

The present invention is implemented to solve the foregoing problems. It is therefore an object of the present invention to provide a mixer circuit capable of achieving high linearity and high gain even at a low power supply voltage.

According to a first aspect of the present invention, there is provided a mixer circuit including a first mixer circuit comprising a first and second MOS transistors connected in cascode; a first impedance element connected to the drain of the first MOS transistor; a first signal input terminal connected to the gate of the first MOS transistor to be supplied with an RF signal; and a second signal input terminal connected to the gate of the second MOS transistor to be supplied with a local signal, wherein a relationship ($V_{G1} - V_{GS2}$) < ($V_{GS2} - V_{T1}$) is established, where $V_{G1}$ is a bias voltage applied to the gate of the first MOS transistor, $V_{GS2}$ is a bias voltage applied to the gate of the second MOS transistor, and $V_{T1}$ is a threshold voltage of the first MOS transistor, the bias voltages $V_{G1}$ and $V_{GS2}$ being each defined with respect to the source bias voltage of the second MOS transistor. Here, the first mixer circuit may further comprises a second impedance element connected between the first impedance element and the first MOS transistor; and a third impedance element connected between the second MOS transistor and the ground. Thus, it can increase the drain-source voltage of the first MOS transistor to which the RF signal is supplied, offering an advantage of being able to implement a high linearity and low distortion mixer circuit even under the condition of a low power supply voltage.

According to a second aspect of the present invention, there is provided a mixer circuit including a first mixer circuit having one of the first signal input terminal and the second signal input terminal connected to a back gate of at least one of the first MOS transistor and the second MOS transistor. The first mixer circuit may comprise the above-mentioned second impedance element and third impedance element. It may further comprise a fourth impedance element connected across one of the first signal input terminal and the second signal input terminal and a back gate of at least one of the first MOS transistor and the second MOS transistor. Besides, the first signal input terminal may be supplied with an RF signal, and the second signal input terminal may be supplied with a local signal. Thus, the mixer circuit can reduce the threshold voltage of the MOS transistor, and hence increase the current flowing through the MOS transistors even under the condition of the low power supply voltage, thereby offering an advantage of being able to increase the gain.

Here, the relationship $(V_{G1}-V_{GS2})<(V_{GS2}-V_{T1})$ may be established. Thus, it can increase the drain-source voltage of the first MOS transistor to which the RF signal is supplied, offering an advantage of being able to implement a high linearity and low distortion mixer circuit even under the condition of a low power supply voltage.

The first signal input terminal may be supplied with a local signal, and the second signal input terminal may be supplied with an RF signal. Thus, the mixer circuit can reduce the threshold voltage of the MOS transistor, and hence increase the current flowing through the MOS transistors even under the condition of the low power supply voltage, thereby offering an advantage of being able to increase the gain.

The first mixer circuit may further comprise a fifth impedance element for connecting one of the first and second signal input terminals to a back gate of at least one of the first MOS transistor and the second MOS transistor, and a third bias circuit for supplying the back gate with a positive bias voltage with respect to the ground. Thus, the mixer circuit can reduce the threshold voltage of the MOS transistor, and hence increase the current flowing through the MOS transistors even under the condition of the low power supply voltage, thereby offering an advantage of being able to increase the gain.

The first mixer circuit may further comprise a switch for supplying the back gate with the positive bias voltage only when the first mixer circuit is in operation, and for short-circuiting the back gate to the second fixed bias point when the first mixer circuit is out of operation. The mixer circuit offers an advantage of being able to reduce the leakage current.

The mixer circuit may further comprise a second mixer circuit with the same configuration as the first mixer circuit, thereby arranging a differential input/output mixer circuit. Thus, it can reduce the distortion. In addition, the differential arrangement, which is often used for the local signal, is advantageous in practical application to achieve the common-mode rejection.

The mixer circuit may further comprise a third impedance element connected between the ground and a common connecting point of two sources of the two second MOS transistors of the first and second mixer circuits. The common connecting point may be connected directly to the ground. Thus, it can reduce the distortion. In addition, the differential arrangement, which is often used for the local signal, is advantageous in practical application to achieve the common-mode rejection.

DETAILED DESCRIPTION OF THE PREFERRED EMBODIMENTS

The invention will now be described with reference to the accompanying drawings.

Embodiment 1

Figure 1:
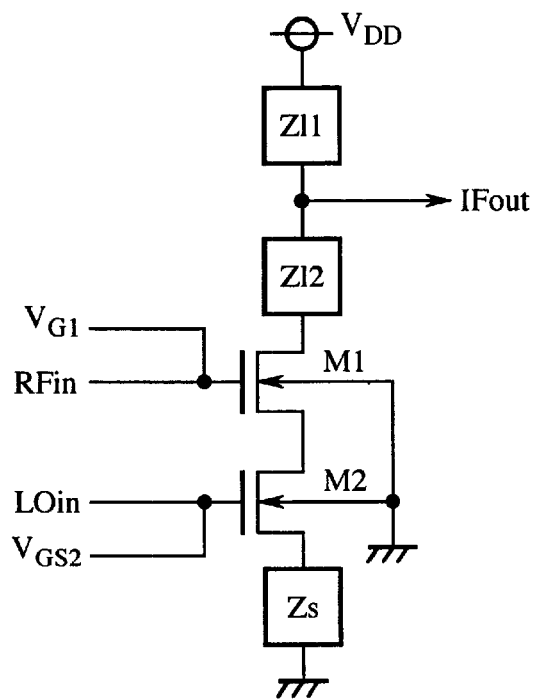
FIG. 1 is a circuit diagram showing a configuration of an embodiment 1 of a cascode mixer circuit with a negative feedback impedance element connected to the source in accordance with the present invention.

FIG. 1 is a circuit diagram showing a configuration of an embodiment 1 of the cascode mixer circuit with a negative feedback impedance element connected to the source in accordance with the present invention. In FIG. 1, the reference symbol $V_{DD}$ designates a power supply terminal (first fixed bias point); Z11 designates an impedance element (first impedance element) that has a DC path and is connected to the power supply terminal $V_{DD}$; and Z12 designates an impedance element (second impedance element) that has a DC path and is connected to the impedance element Z11.

The reference symbol M1 designates a MOSFET (first MOS transistor) having its drain connected to the impedance element Z12; M2 designates a MOSFET (second MOS transistor) having its drain connected to the source of the MOSFET M1; and Zs designates an impedance element (third impedance element) that has a DC path and is connected to the source of the MOSFET M2. The impedance element Zs is connected to a ground terminal (second fixed bias point), and the back gates of the MOSFETs M1 and M2 are connected to the ground terminal.

The impedance elements Z11, Z12 and Zs are composed of a passive element such as a resistor, capacitor and inductance.

The reference symbol RFin designates an RF (radio frequency) signal input terminal connected to the gate of the MOSFET M1; LOin designates an LO (local) signal input terminal connected to the gate of the MOSFET M2, and IFout designates an output terminal connected between the impedance elements Z11 and Z12.

The present embodiment 1 of the mixer circuit is configured such that the relationship of $(V_{G1}-V_{GS2})<(V_{GS2}-V_{T2})$ is held, that is, the relationship of $(V_{G1}-V_{GS2})<(V_{GS2}-V_{T1})$ is held considering that the threshold voltages $V_{T2}$ and $V_{T1}$ have substantially the same value, where $V_{G1}$ is the gate bias voltage of the MOSFET M1 with respect to the source bias voltage of the MOSFET M2, $V_{GS2}$ is the gate-source bias voltage of the MOSFET M2, $V_{T1}$ is the threshold voltage of the MOSFET M1, and $V_{T2}$ is the threshold voltage of the MOSFET M2.

Figure 2:
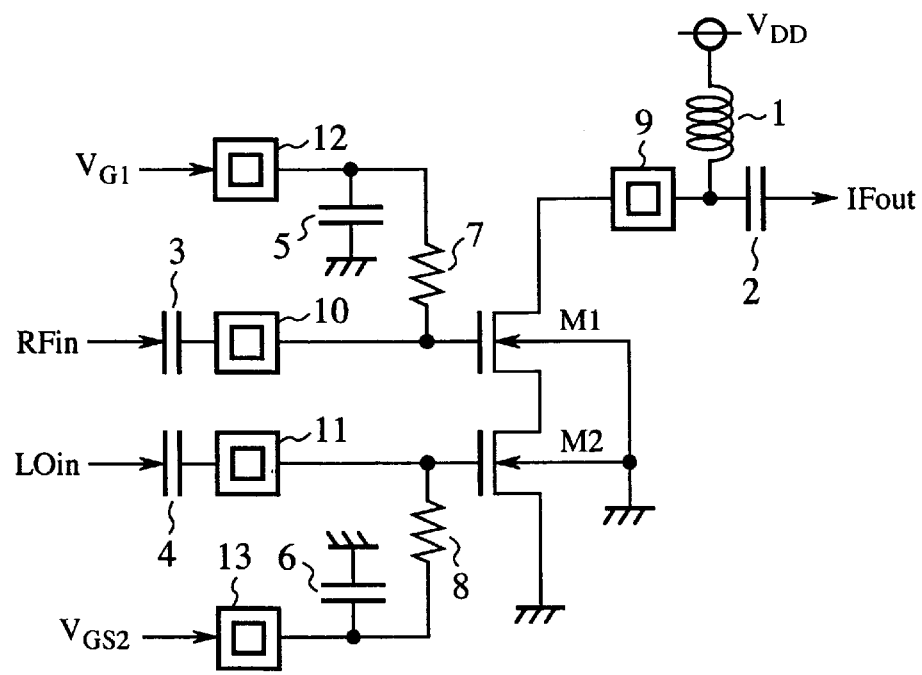
FIG. 2 is a circuit diagram showing a concrete configuration of the embodiment 1 of the mixer circuit in accordance with the present invention.

FIG. 2 is a circuit diagram showing a concrete configuration of the embodiment 1 of the mixer circuit in accordance with the present invention. In FIG. 2, the reference numeral 1 designates an inductance, reference numerals 2–6 each designate a capacitor, 7 and 8 each designate a resistor, and 9–13 each designate a pad.

Next, the operation of the present embodiment 1 will be described.

In FIG. 2, the bias voltage $V_{G1}$ is applied via the pad 12 to the RF input signal fed from the RF signal input terminal RFin. Likewise, the bias voltage $V_{GS2}$ is applied via the pad 13 to the LO input signal fed from the LO signal input terminal LOin. In this case, the voltage $(V_{G1}-V_{GS2})$ is set at a small value of about 0.1 V, for example.

Thus, a large voltage can be established as the drain-source voltage of the MOSFET M1 to which the RF input signal is input, thereby implementing the high linearity and low distortion even under the condition of the low power supply voltage. In this case, although the drain voltage of the MOSFET M2 is biased at a low voltage, it presents no problem because the MOSFET M2 carries out only the switching operation.

As described above, the present embodiment 1 can achieve the high linearity and low distortion even under the condition of the low power supply voltage.

Incidentally, the impedance elements Z12 and Zs of mixer circuit as shown in FIG. 1 can be eliminated depending on a situation.

Embodiment 2

Figure 3:
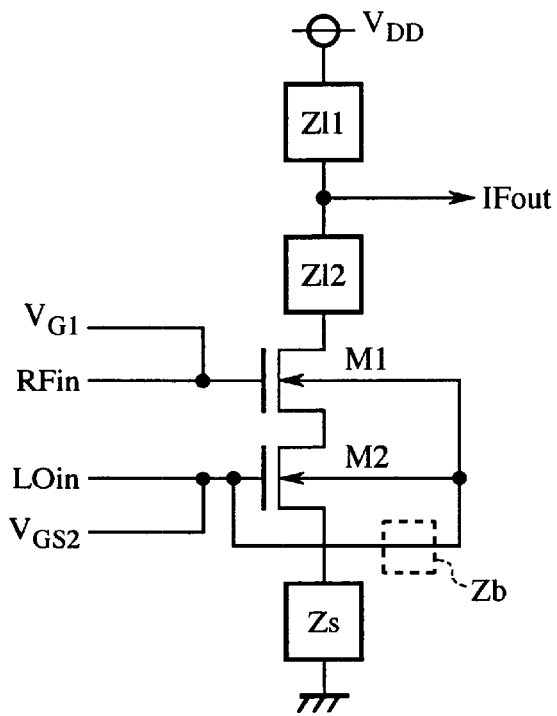
FIG. 3 is a circuit diagram showing a configuration of an embodiment 2 of the cascode mixer circuit with a negative feedback impedance element connected to the source in accordance with the present invention.

FIG. 3 is a circuit diagram showing a configuration of an embodiment 2 of the cascode mixer circuit with a negative feedback impedance element connected to the source in accordance with the present invention. The configuration of FIG. 3 is the same as that of FIG. 1 except that the LO signal input terminal Loin is connected to the back gates of the MOSFETs M1 and M2. The remaining configuration of FIG. 3 is the same as that of FIG. 1.

As for the MOSFETs M1 and M2 of the present embodiment 2, however, they must have such a structure as a triple well or SOI (Silicon On Insulator) structure that electrically isolates the potential of the back gate from transistor to transistor, so that the back gate of each transistor is controllable.

Next, the operation of the present embodiment 2 will be described.

In the mixer circuit as shown in FIG. 3, the bias condition of the MOSFETs M1 and M2 is made identical to that of the foregoing embodiment 1 to enable the large drain-source voltage of the MOSFET M1 to which the RF input signal is input. Thus, the present embodiment 2 can implement the high linearity and low distortion even under the condition of the low power supply voltage.

Furthermore, the LO input signal is supplied not only to the gate of the MOSFET M2, but also to its back gate to bias it at the same potential as the gate. This brings about the substrate bias effect given by the following expression (5), which reduces the threshold voltage $V_T$ of the MOSFET M2, and provides a large current even under the condition of the low power supply voltage, thereby achieving the high gain.

$$V_T = V_{T0} + \gamma[\sqrt{|2\phi_{F-V_{GS}}|} - \sqrt{|2\phi_F|}] \quad (5)$$

where $V_{T0}$ is the threshold voltage without any bias, $\phi_F$ is a surface potential (a constant determined by the impurity concentration of the substrate), and $\gamma$ is a substrate bias effect coefficient.

Furthermore, as indicated by the following expression (6), the transconductance of the MOSFET M2 increases as compared when the back gate potential is fixed (the $\beta$ in this case is placed as $\beta_0$), thereby achieving the mixing operation even at lower LO power.

$$\left(\frac{\beta}{\beta_0}\right) = \frac{\left(1 + \dfrac{\gamma}{2\sqrt{|2\phi_F - V_{GS}|}}\right)(V_{GS} - V_{T0} - \gamma[\sqrt{|2\phi_F - V_{GS}|} - \sqrt{|2\phi_F|}])}{(V_{GS} - V_{T0})} \quad (6)$$

Moreover, since the LO input signal is also applied to the back gate of the MOSFET M1, the MOSFET M1 also brings about the mixing effect.

As described above, the present embodiment 2 can reduce the threshold voltage $V_T$ of the MOSFET M2, and provide the large current under the condition of the low power supply voltage, thereby implementing the high gain. In addition, the increasing transconductance of the MOSFET M2 enables the mixing operation even at the lower LO power.

Moreover, since the LO input signal is applied to the back gate of the MOSFET M1, the MOSFET M1 can also bring about the mixing effect.

The mixer circuit as shown in FIG. 3 can offer similar advantages when the RF signal input terminal RFin is connected to at least one of the back gates of the MOSFETs M1 and M2.

Furthermore, according to the circumstances, the LO signal input terminal LOin or RF signal input terminal RFin can be connected to the back gates of the MOSFETs M1 and M2 via an impedance element Zb (fourth impedance element) with a DC path, offering the same advantages.

Embodiment 3

Figure 4:
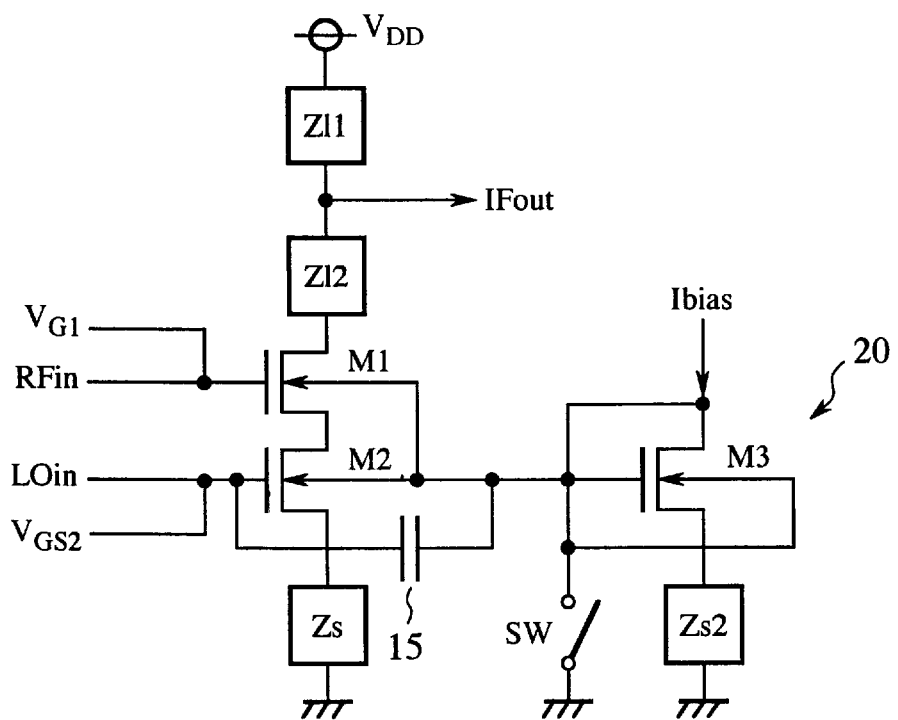
FIG. 4 is a circuit diagram showing a configuration of an embodiment 3 of the cascode mixer circuit with a negative feedback impedance element connected to the source in accordance with the present invention.

FIG. 4 is a circuit diagram showing a configuration of an embodiment 3 of the cascode mixer circuit with a negative feedback impedance element connected to the source in accordance with the present invention. In this figure, the reference 15 designates a capacitor (fifth impedance element) without a DC path, which is connected across the LO signal input terminal LOin and the back gates of the MOSFETs M1 and M2.

The reference symbol Ibias is a bias current terminal; M3 designates an MOSFET having its drain connected to the bias current terminal Ibias; and Zs2 designates an impedance element that has a DC path and is connected to the source of the MOSFET M3. The impedance element Zs2 is connected to the ground terminal.

The back gates of the MOSFETs M1 and M2 are connected to the drain and back gate of the MOSFET M3. The reference symbol SW designates a switch connected between the connecting point of them and the ground terminal. The MOSFET M3, the impedance element Zs2 and the switch SW constitute a bias circuit 20. The remaining configuration is the same as that of FIG. 3.

Next, the operation of the present embodiment 3 will be described.

When the mixer circuit as shown in FIG. 4 is in operation, the switch SW is opened. Thus, the MOSFET M3 supplies the back gates of the MOSFETs M1 and M2 with abias voltage that is positive with respect to the sources of the MOSFETs M1 and M2 and that corresponds to the impedance element Zs2 and the bias current flowing into it from the bias current terminal Ibias.

This configuration can further reduce the threshold voltage $V_T$ and increase the gain by a large current obtained even under the condition of the low power supply voltage. In this case, the capacitor 15 prevents a DC path from being established from the bias current terminal Ibias to the LO signal input terminal LOin.

On the other hand, when the mixer circuit is out of operation, the switch SW is closed. Thus, the back gates of the MOSFETs M1 and M2 are connected to the ground terminal, thereby reducing the leakage current of the MOSFETs M1 and M2.

As described above, the present embodiment 3 can further reduce the threshold voltage $V_T$ and increase the gain because of the large current obtained even under the condition of the low power supply voltage.

In addition, the present embodiment 3 can reduce the leakage current through the MOSFETs M1 and M2.

Embodiment 4

Figure 5:
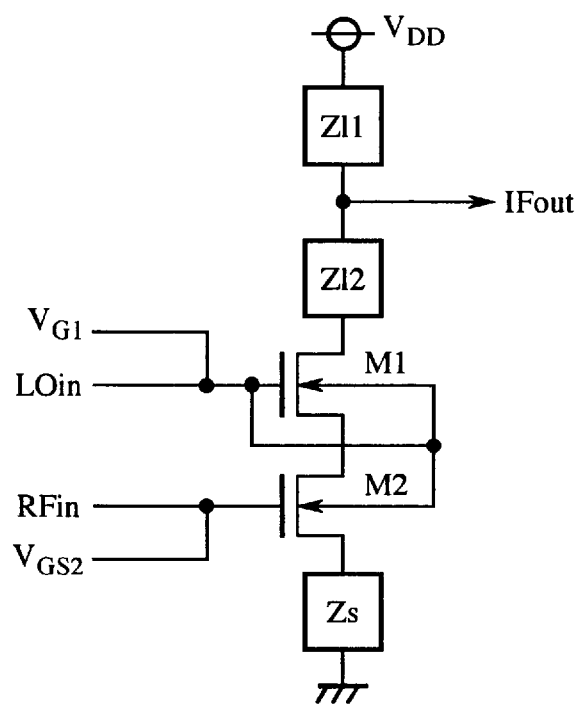
FIG. 5 is a circuit diagram showing a configuration of an embodiment 4 of the cascode mixer circuit with a negative feedback impedance element connected to the source in accordance with the present invention.

FIG. 5 is a circuit diagram showing a configuration of an embodiment 4 of the cascode mixer circuit with a negative feedback impedance element connected to the source in accordance with the present invention. It differs from the configuration of FIG. 3 in that the LO signal input terminal LOin is connected to the gate of the MOSFET M1, and the RF signal input terminal RFin is connected to the gate of the MOSFET M2. The remaining configuration is the same as that of FIG. 3.

As the foregoing embodiment 2, the present embodiment 4 can reduce the threshold voltage $V_T$ and increase the gain because of the large current obtained even under the condition of the low power supply voltage.

In addition, the increasing transconductance of the MOSFET M1 enables the mixing operation at lower LO power.

Furthermore, since the LO input signal is applied to the back gate of the MOSFET M2, the MOSFET M2 can also bring about the mixing effect.

Incidentally, the bias circuit 20 as shown in FIG. 4 of the foregoing embodiment 3 is also applicable to the mixer circuit of the present embodiment 4 as shown in FIG. 5, offering similar advantages as the foregoing embodiment 3.

Embodiment 5

Figure 6:
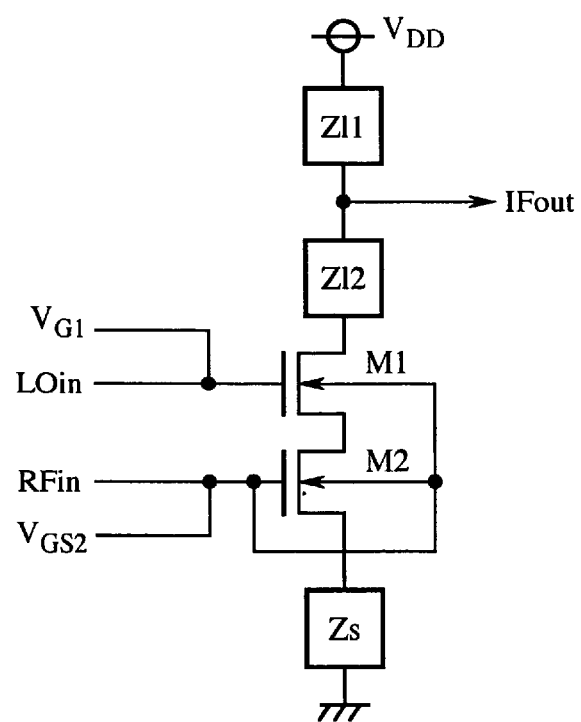
FIG. 6 is a circuit diagram showing a configuration of an embodiment 5 of the cascode mixer circuit with a negative feedback impedance element connected to the source in accordance with the present invention.

FIG. 6 is a circuit diagram showing a configuration of an embodiment 5 of the cascode mixer circuit with a negative feedback impedance element connected to the source in accordance with the present invention. It differs from the configuration as shown in FIG. 5 in that the RF signal input terminal RFin is connected to the back gates of the MOSFETs M1 and M2. The remaining configuration is the same as that of FIG. 5.

As described above, the present embodiment 5 can reduce the threshold voltage $V_T$ and increase the gain because of the large current achieved even under the condition of the low power supply voltage.

In addition, the increasing transconductance of the MOSFET M2 enables the mixing operation at lower RF power.

Furthermore, since the RF input signal is applied to the back gate of the MOSFET M1, the MOSFET M1 can also bring about the mixing effect.

The bias circuit 20 as shown in FIG. 4 of the foregoing embodiment 3 is also applicable to the mixer circuit of the present embodiment 5 as shown in FIG. 6, offering similar advantages as the foregoing embodiment 3.

Embodiment 6

Figure 7:
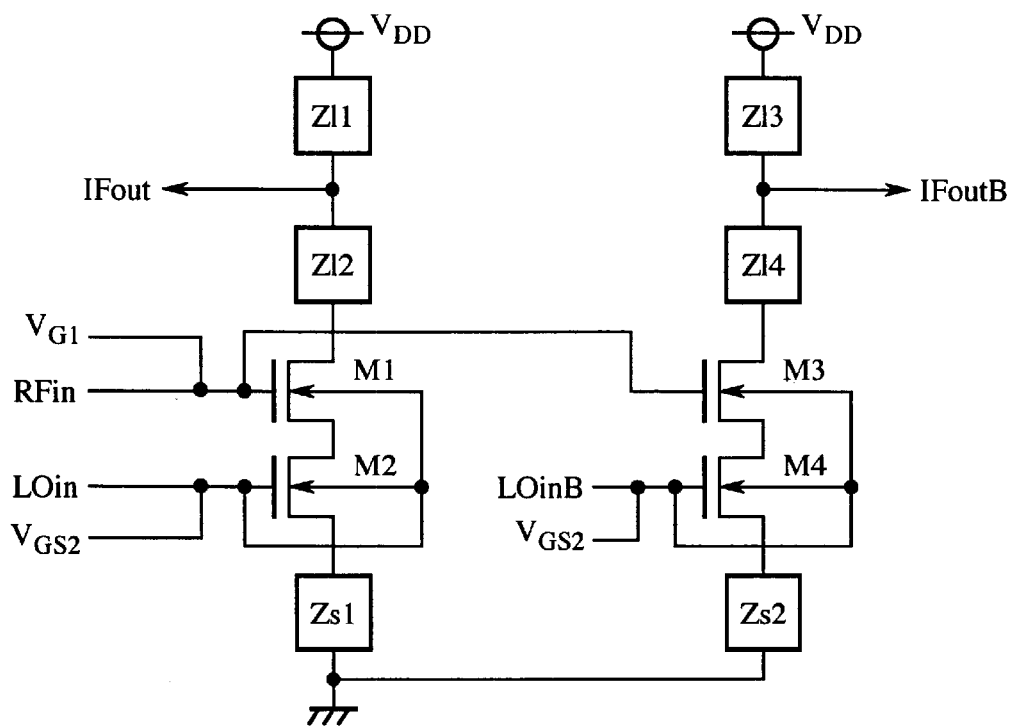
FIG. 7 is a circuit diagram showing a configuration of an embodiment 6 of the cascode mixer circuit with a negative feedback impedance element connected to the source in accordance with the present invention.

FIG. 7 is a circuit diagram showing a configuration of an embodiment 6 of the cascode mixer circuit with a negative feedback impedance element connected to the source in accordance with the present invention, which uses a pair of mixer circuits as shown in FIG. 3.

In this figure, reference symbols Z13, Z14, Zs1 and Zs2 each designate an impedance element with a DC path; and M3 and M4 each designate a MOSFET.

It applies the LO input signal to differential inputs. Specifically, it uses the LO signal input terminal LOin as a positive-phase differential input terminal, and a local signal input terminal LOinB as a negative-phase differential input terminal. In addition, it uses the output terminal IFout as a positive-phase differential output terminal, and an output terminal IfoutB as a negative-phase differential output terminal.

Thus, the present embodiment 6 offers advantages similar to those of the foregoing embodiment 2. In addition, the differential arrangement is often used for the local signal, which is advantageous in practical application to achieve the common-mode rejection.

Although the present embodiment 6 employs a pair of the mixer circuits of the foregoing embodiment 2 as shown in FIG. 3, this is not essential. For example, it is also possible to utilize a pair of mixer circuits of the foregoing embodiment 1 as shown in FIG. 1, those of the foregoing embodiment 3 as shown in FIG. 4, or those of the foregoing embodiment 5 as shown in FIG. 6, offering similar advantages.

Embodiment 7

Figure 8:
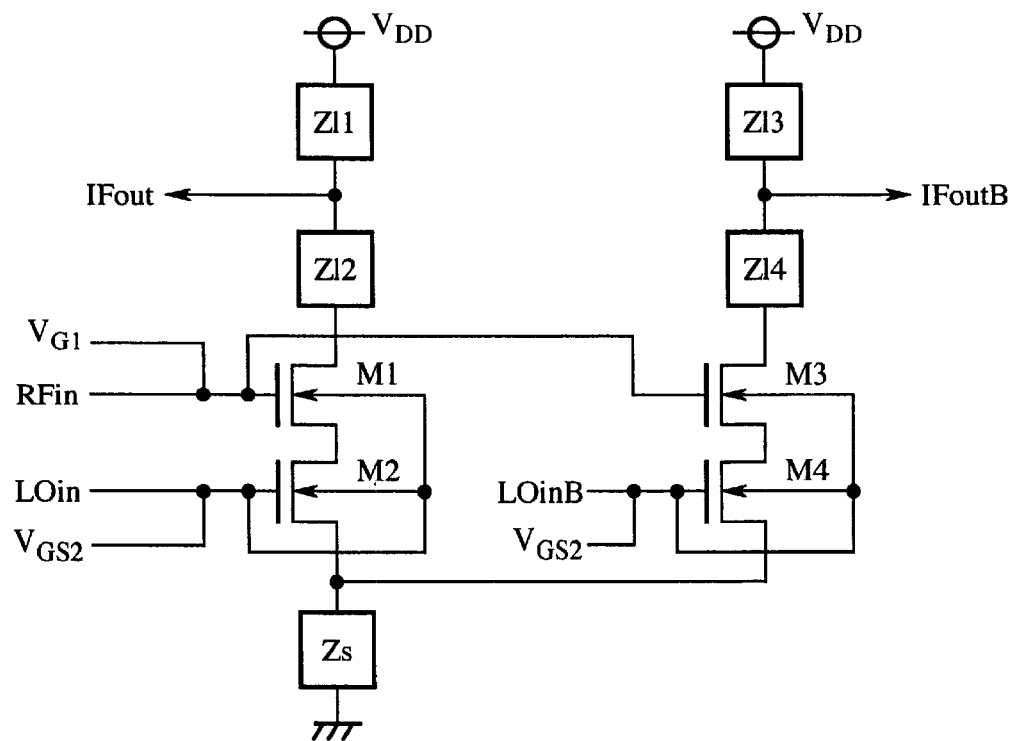
FIG. 8 is a circuit diagram showing a configuration of an embodiment 7 of the cascode mixer circuit with a negative feedback impedance element connected to the source in accordance with the present invention.
Figure 9:
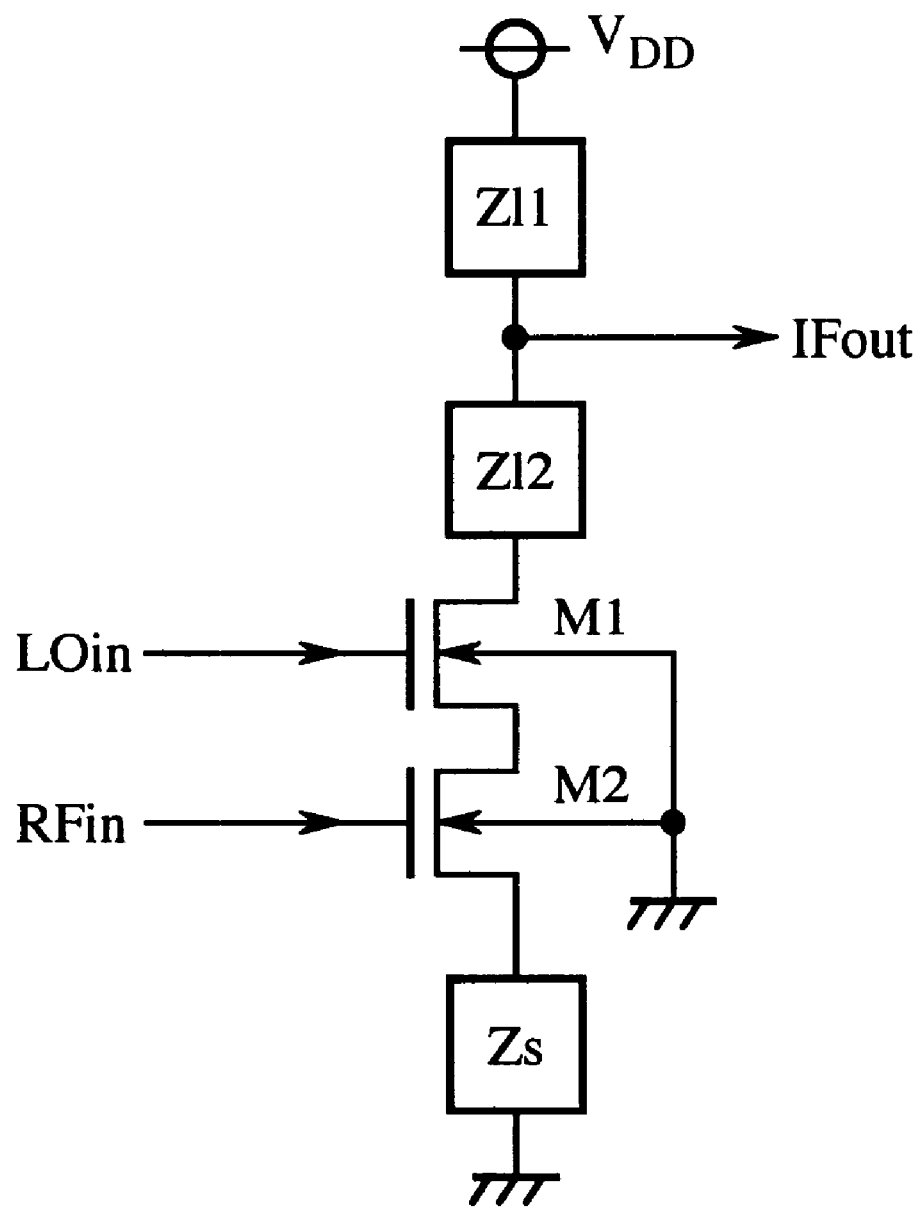
FIG. 9 is a circuit diagram showing a configuration of a conventional cascode mixer circuit with a negative feedback impedance element connected to the source.

FIG. 8 is a circuit diagram showing a configuration of an embodiment 7 of the cascode mixer circuit with a negative feedback impedance element connected to the source in accordance with the present invention. It differs from the configuration as shown in FIG. 7 in that the sources of the MOSFET M2 and M4 are connected to each other, and the impedance elements Zs1 and Zs2 are reduced to a single impedance element Zs. The remaining configuration is the same as that of FIG. 7.

The present embodiment 7 can achieve the advantages similar to the foregoing embodiment 6.

What is claimed is:

1. A mixer circuit including a first mixer circuit comprising:

a first impedance element that has a DC path and is connected to a first fixed bias point;

a first MOS transistor having its drain connected to said first impedance element;

a second MOS transistor having its drain connected to a source of said first MOS transistor;

a second fixed bias point connected to a source of said second MOS transistor;

a first signal input terminal that is connected to a gate of said first MOS transistor, the first signal input terminal being supplied with an RF signal;

a second signal input terminal that is connected to a gate of said second MOS transistor, the second signal input terminal being supplied with a local signal;

an output terminal connected to a connecting point of said first impedance element and said first MOS transistor;

a first bias circuit for applying a bias voltage $V_{G1}$ to the gate of said first MOS transistor, the bias voltage $V_{G1}$ being defined with respect to said second fixed bias point; and a second bias circuit for applying a bias voltage $V_{GS2}$ to the gate of said second MOS transistor, the bias voltage $V_{GS2}$ being defined with respect to said second fixed bias point, wherein a relationship $(V_{G1}-V_{GS2})<(V_{GS2}-V_{T1})$ is established, where $V_{T1}$ is a threshold voltage of said first MOS transistor.

2. The mixer circuit according to claim 1, wherein said first mixer circuit further comprises:

a second impedance element that has a DC path and is connected between said first impedance element and the drain of said first MOS transistor; and a third impedance element that has a DC path and is connected between the source of said second MOS transistor and said second fixed bias point, and wherein said output terminal is connected at a connecting point of said first impedance element and said second impedance element.

3. The mixer circuit according to claim 1, wherein said first mixer circuit further comprises:

an impedance element that has no DC path and connects one of said first signal input terminal and said second signal input terminal to a back gate of at least one of said first MOS transistor and said second MOS transistor; and a third bias circuit for supplying said back gate with a positive bias voltage with respect to a potential of said second fixed bias point.

4. The mixer circuit according to claim 1, further comprising a second mixer circuit with a same configuration as said first mixer circuit, wherein two second signal input terminals of said first mixer circuit and said second mixer circuit constitute positive phase and negative phase differential input terminals, and two output terminals of said first mixer circuit and said second mixer circuit constitute positive phase and negative phase differential output terminals.

5. The mixer circuit according to claim 4, further comprising another impedance element that has a DC path and is connected across said second fixed bias point and a common connecting point of two sources of said second MOS transistors of said first mixer circuit and said second mixer circuit.

6. The mixer circuit according to claim 4, wherein a common connecting point of two sources of said second MOS transistors of said first mixer circuit and said second mixer circuit is connected to said second fixed bias point.

7. A mixer circuit including a first mixer circuit comprising:

a first impedance element that has a DC path and is connected to a first fixed bias point;

a first MOS transistor having its drain connected to said first impedance element;

a second MOS transistor having its drain connected to a source of said first MOS transistor;

a second fixed bias point connected to a source of said second MOS transistor;

a first signal input terminal connected to a gate of said first MOS transistor;

a second signal input terminal connected to a gate of said second MOS transistor; and an output terminal connected to a connecting point of said first impedance element and said first MOS transistor;

wherein one of said first signal input terminal and said second signal input terminal is connected to a back gate of at least one of said first MOS transistor and said second MOS transistor.

8. The mixer circuit according to claim 7, wherein said first mixer circuit further comprises:

a second impedance element that has a DC path and is connected between said first impedance element and the drain of said first MOS transistor; and a third impedance element that has a DC path and is connected between the source of said second MOS transistor and said second fixed bias point, and wherein said output terminal is connected at a connecting point of said first impedance element and said second impedance element.

9. The mixer circuit according to claim 7, wherein said first mixer circuit further comprises another impedance element that has a DC path, said another impedance element being connected across one of said first signal input terminal and said second signal input terminal and a back gate of at least one of said first MOS transistor and said second MOS transistor.

10. The mixer circuit according to claim 7, wherein said first mixer circuit further comprises a first bias circuit for applying a bias voltage $V_{G1}$ to the gate of said first MOS transistor, the bias voltage $V_{G1}$ being defined with respect to said second fixed bias point; and a second bias circuit for applying a bias voltage $V_{GS2}$ to the gate of said second MOS transistor, the bias voltage $V_{GS2}$ being defined with respect to said second fixed bias point, and wherein a relationship $(V_{G1}-V_{GS2})<(V_{GS2}-V_{T1})$ is established, where $V_{T1}$ is a threshold voltage of said first MOS transistor.

11. The mixer circuit according to claim 7, wherein said first signal input terminal is supplied with an RF signal, and said second signal input terminal is supplied with a local signal.

12. The mixer circuit according to claim 7, wherein said first signal input terminal is supplied with a local signal, and said second signal input terminal is supplied with an RF signal.

13. The mixer circuit according to claim 7, wherein said first mixer circuit further comprises:

an impedance element that has no DC path and connects one of said first signal input terminal and said second signal input terminal to a back gate of at least one of said first MOS transistor and said second MOS transistor; and a bias circuit for supplying said back gate with a positive bias voltage with respect to a potential of said second fixed bias point.

14. The mixer circuit according to claim 13, wherein said bias circuit further comprises a switch for supplying said back gate with the positive bias voltage only when said first mixer circuit is in operation and for short-circuiting said back gate to said second fixed bias point when said first mixer circuit is out of operation.

15. The mixer circuit according to claim 7, further comprising a second mixer circuit with a same configuration as said first mixer circuit, wherein two second signal input terminals of said first mixer circuit and said second mixer circuit constitute positive phase and negative phase differential input terminals, and two output terminals of said first mixer circuit and said second mixer circuit constitute positive phase and negative phase differential output terminals.

16. The mixer circuit according to claim 15, further comprising another impedance element that has a DC path and is connected across said second fixed bias point and a common connecting point of two sources of said second MOS transistors of said first mixer circuit and said second mixer circuit.

17. The mixer circuit according to claim 15, wherein a common connecting point of two sources of said second MOS transistors of said first mixer circuit and said second mixer circuit is connected to said second fixed bias point.

* * * * *